United States Patent [19]
Gallo et al.

[11] Patent Number: 5,886,320
[45] Date of Patent: Mar. 23, 1999

[54] LASER ABLATION WITH TRANSMISSION MATCHING FOR PROMOTING ENERGY COUPLING TO A FILM STACK

[75] Inventors: Antonio R. Gallo, Pleasant Valley, N.Y.; Pei-Ing P. Lee, Taoyuan, Taiwan

[73] Assignee: International Business Machines Corporation, Armonk, N.Y.

[21] Appl. No.: 707,281

[22] Filed: Sep. 3, 1996

[51] Int. Cl.$^6$ ................................................. B23K 26/00
[52] U.S. Cl. ............................... 219/121.72; 219/121.69; 219/121.68; 219/121.85
[58] Field of Search ........................... 219/121.6, 121.61, 219/121.67, 121.68, 121.69, 121.72, 121.73, 121.74, 121.78, 121.82, 121.85; 29/847; 437/173; 257/209, 529; 438/601, 940, 662

[56] References Cited

U.S. PATENT DOCUMENTS

| | | |
|---|---|---|
| 3,396,401 | 8/1968 | Nonomura ........................ 219/121.78 |
| 3,874,075 | 4/1975 | Lohse ................................. 219/121.85 |
| 4,414,038 | 11/1983 | Dausinger et al. . |
| 4,664,940 | 5/1987 | Bensoussan et al. . |
| 4,678,889 | 7/1987 | Yamanaka .......................... 219/121.69 |
| 4,774,561 | 9/1988 | Takagi .................................... 257/529 |
| 4,885,751 | 12/1989 | Terreur . |
| 5,021,362 | 6/1991 | Chlipala ................................. 437/173 |
| 5,043,553 | 8/1991 | Corfe et al. . |
| 5,059,759 | 10/1991 | Kudo et al. . |
| 5,504,303 | 4/1996 | Nagy ................................. 219/121.68 |

*Primary Examiner*—Teresa J. Walberg
*Assistant Examiner*—Gregory L. Mills
*Attorney, Agent, or Firm*—Whitham, Curtis & Witham; Eric Petraske

[57] ABSTRACT

The amount of laser energy absorbed by a dielectric material during laser fuse blow is increased by changing the angle at which the laser is transmitted. An increased angle of incidence will result in increased energy absorption at the top and edge of the device. This technique may eliminate the need for second pass fuse blow.

14 Claims, 8 Drawing Sheets

5,886,320

LASER ABLATION WITH TRANSMISSION MATCHING FOR PROMOTING ENERGY COUPLING TO A FILM STACK

BACKGROUND OF THE INVENTION

1. Field of the Invention

The present invention generally relates to laser fuse blow techniques used in integrated circuit arrays to invoke redundant elements of the array and, more particularly, to an improvement in laser ablation to improve fuse blow yield.

2. Background Description

Laser ablation at normal incidence is currently used to ablate or open electrical lines in many integrated circuit (IC) devices such as dynamic random access memories (DRAMs) or static random access memories (SRAMs) to invoke redundant elements of the array. This is necessary as it can be shown that without redundancy, the manufacturing yields for a complex process as needed for a sixty-four megabyte (64 MB) DRAM device would be very low indeed.

FIG. 1 shows an example of a multilayer stack of dielectric material surrounding an electrical line constituting a fuse which is to be blown. The top film layer 11 is a silicon dioxide ($SiO_2$) layer having an optical constant defined by its index of refraction n=1.44–0i. Layer 12 is a thin silicon nitride ($Si_3N_4$) layer with n=1.99–0i. Layer 13 is an absorbing tungsten silicide layer (WSi), having an n=3.90–1.6i. Layer 14 is a polysilicon layer having n=3.4–0.02i. Finally, layer 15 is another oxide layer which has the same optical constants as layer 11. This stack is assumed to lie on top of a silicon (Si) substrate 16 having "infinite" thickness and n=3.54–0i. All the constants are given for the wavelength of interest, that of a yttrium aluminum garnet (YAG) infrared (IR) laser at a wavelength ($\lambda$) of 1.06 micrometer ($\mu$m).

Arrow 17 represents incident light energy, while arrows 18, 19 and 20 represent light energy reflected at each interface. The electric and magnetic fields are perpendicular to the direction of the light energy 17. The reflections 18, 19 and 20 at each interface cause an almost 180° reversal of the electric and magnetic fields. This reversal cancels the energy which passes through the multilayer stack.

For such a film stack, incident light energy 17, would show a variation of energy absorbed by the film as a sinusoidal curve which is a function of the thickness of the films. This is calculated easily and shown in FIG. 2. The point of interest is that there is only about 40% absorption of the energy at the thickness of choice. Of course, other thicknesses give higher absorption, but may not be possible from a process design point of view. For instance, higher thicknesses may cause unsuccessful fuse ablation while much thinner thicknesses may not give the appropriate level of electrical or environmental protection needed for high yields and reliability of the device.

SUMMARY OF THE INVENTION

It is therefore an object of the present invention to improve the laser energy coupling to a dielectric film stack and improve the fuse blow yield.

It is another object of the invention to reduce over all fuse blow process sensitivity to the dielectric film stack variation.

The present invention employs the use of non-normal incidence radiation to improve the energy absorbed by the dielectric film stack. By changing the angle of the incident radiation and carefully optimizing the polarization angle, both the coupling of laser energy to the stack is improved and overall process sensitivity of stack variation is reduced.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 3:
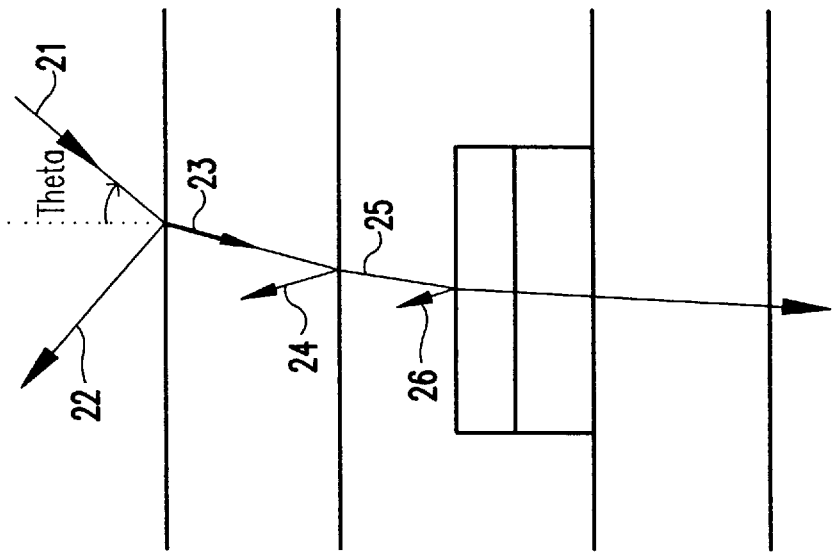
FIG. 3 is a cross-sectional representation of the dielectric film stack of FIG. 1 showing the application of a non-normal laser beam for blowing a fuse according to the invention.
Figure 1:
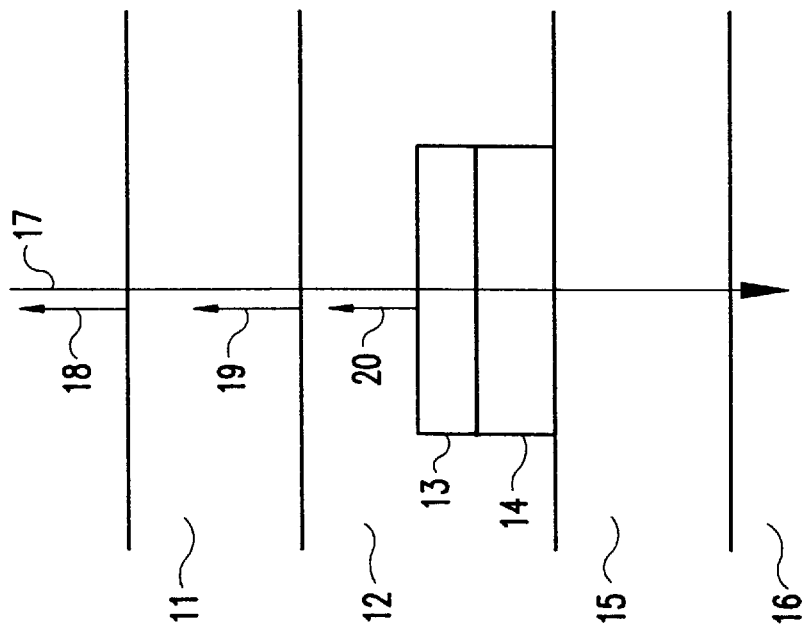
FIG. 1 is a cross-sectional representation of a dielectric film stack showing the application of a normal incidence laser beam for blowing a fuse.

Referring again to the drawings, and more particularly to FIG. 3, there is shown a film stack similar to that of FIG. 1, but non-normal incidence radiation is used to improve the energy absorbed by the film. Theta is defined as the angle of incidence of the laser beam, represented by the arrow 21, and the arrows 22 to 26 depict the path that light rays would follow on each reflection and transmission at the interfaces of the films.

Figure 4:
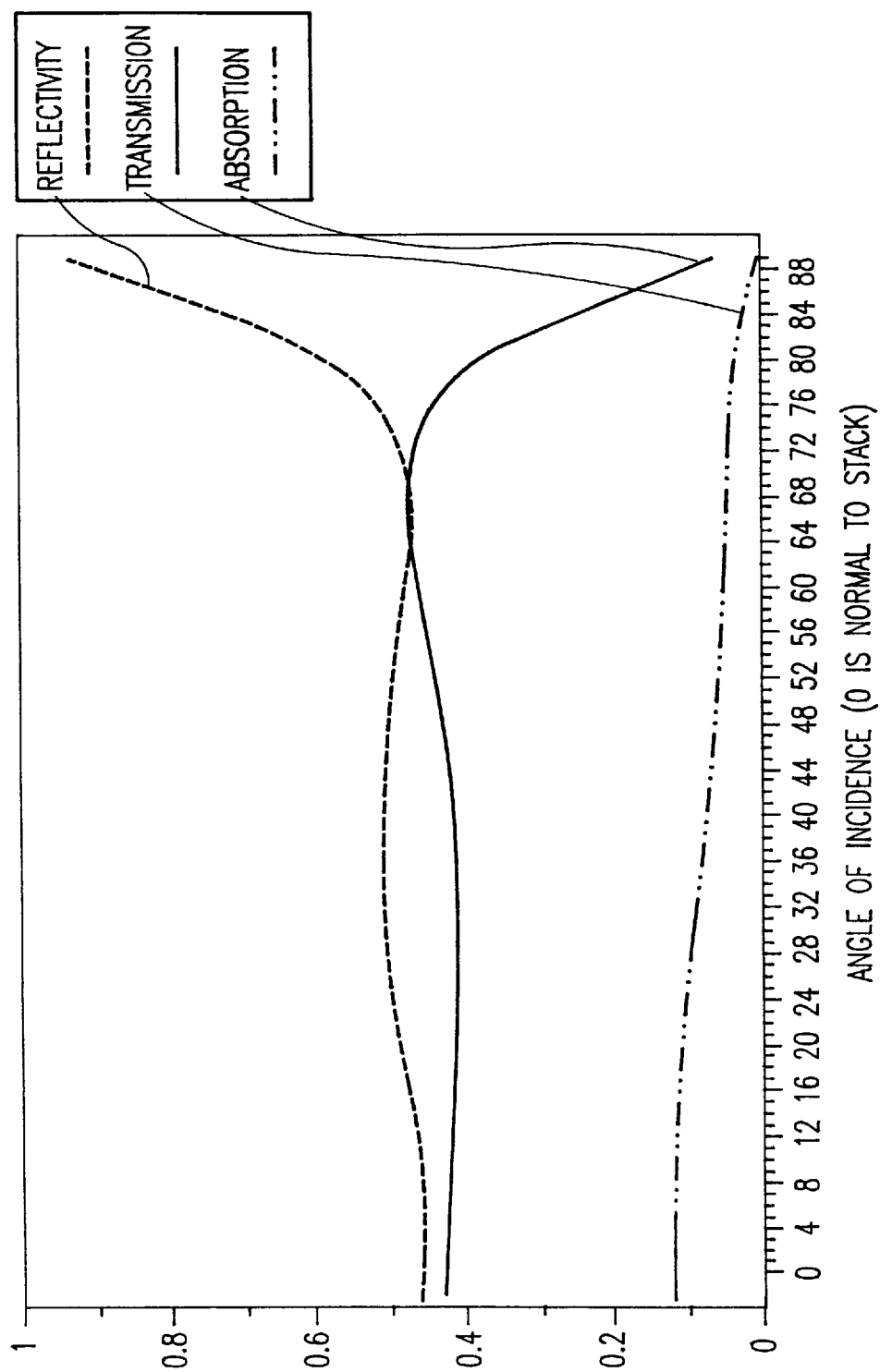
FIG. 4 is a graph showing the functions for reflection, absorption and transmission of the non-normal laser beam of FIG. 3 as a function of angle of incidence to the stack for S polarized light.
Figure 5:
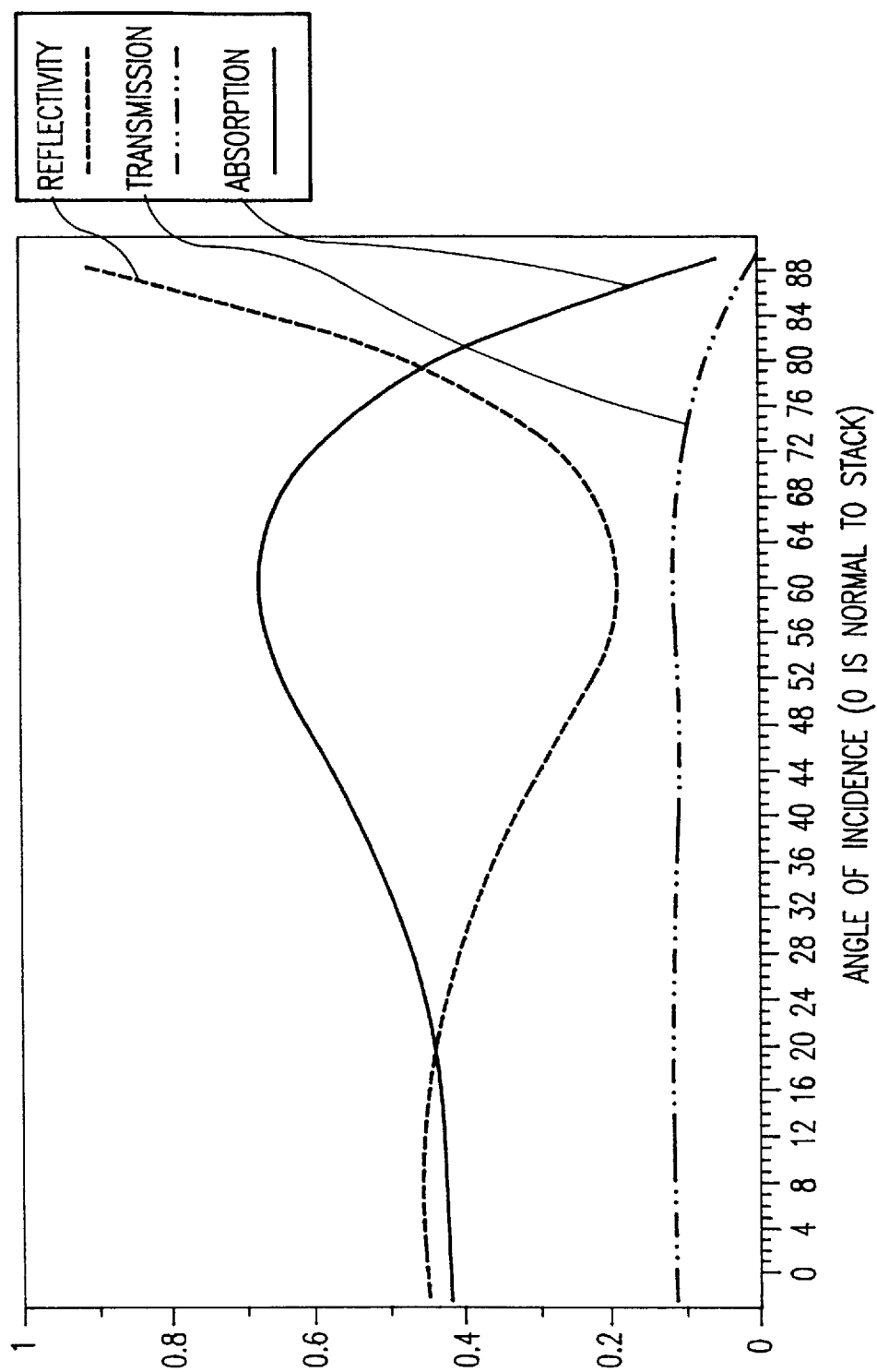
FIG. 5 is a graph showing the functions for reflection, absorption and transmission of the non-normal laser beam of FIG. 3 as a function of angle of incidence to the stack for P polarized light.

FIGS. 4 and 5 show the angular dependence of the energy absorbed and transmitted by the stack. Since at non-normal incidence, the polarization parallel and perpendicular to the plane of incidence is no longer equivalent, the problem needs to be broken down to the two cases. This is not a problem, and in fact, since the laser radiation is typically polarized, we can take advantage of this orientation as well. The example of FIG. 5 shows that by just changing the angle of incidence to 60°, the amount of energy coupled to the film has increased from 40 to 60%. That is, a laser 50% stronger would have to be used at normal incidence to couple the same amount of energy into the film.

Figure 6:
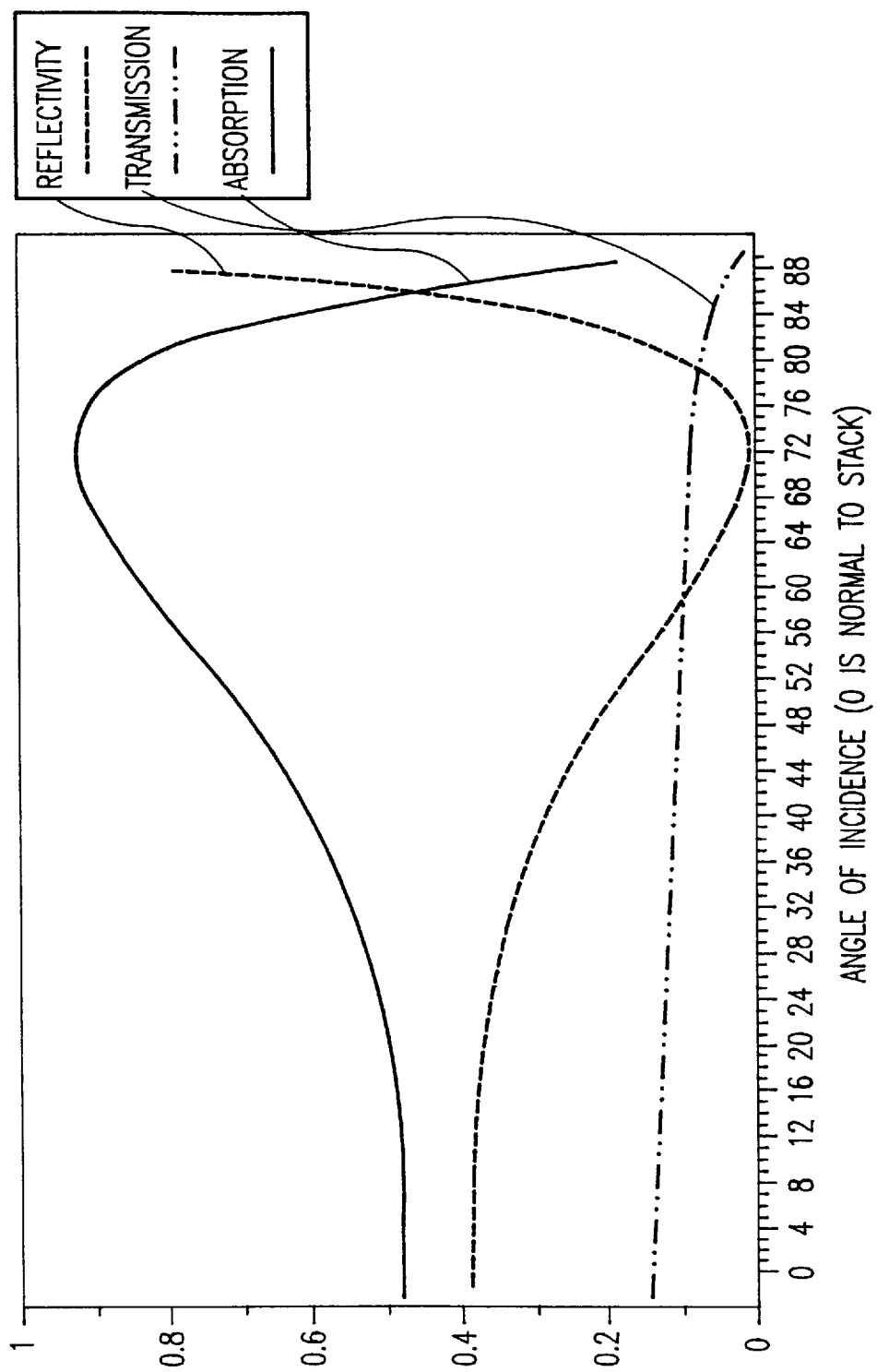
FIG. 6 is a graph showing the functions for reflection, absorption and transmission of the non-normal laser beam of FIG. 3 as a function of angle of incidence to a 300 nm fuse oxide for S polarized light.

An even more dramatic improvement is shown in FIG. 6 for a 300 nm film, where by comparison to the normal incidence case of only 40% coupling of the energy of the laser, a change of angle of incidence can give as high as 90% coupling.

Local topography and stack thicknesses optimal for process and device needs will limit the angle of incidence possible. For current fuse dimensions and aspect ratios, this limit is a comfortable 45°. The conic projection of the laser to the fuse window at this angle would not infringe on adjacent fuses and would not lead to erroneous fuses being blown. In fact, the high index of refraction of the first layer guarantees that the laser beam will bend towards the fuse at high angles and thus would not infringe on adjacent fuses.

Figure 2:
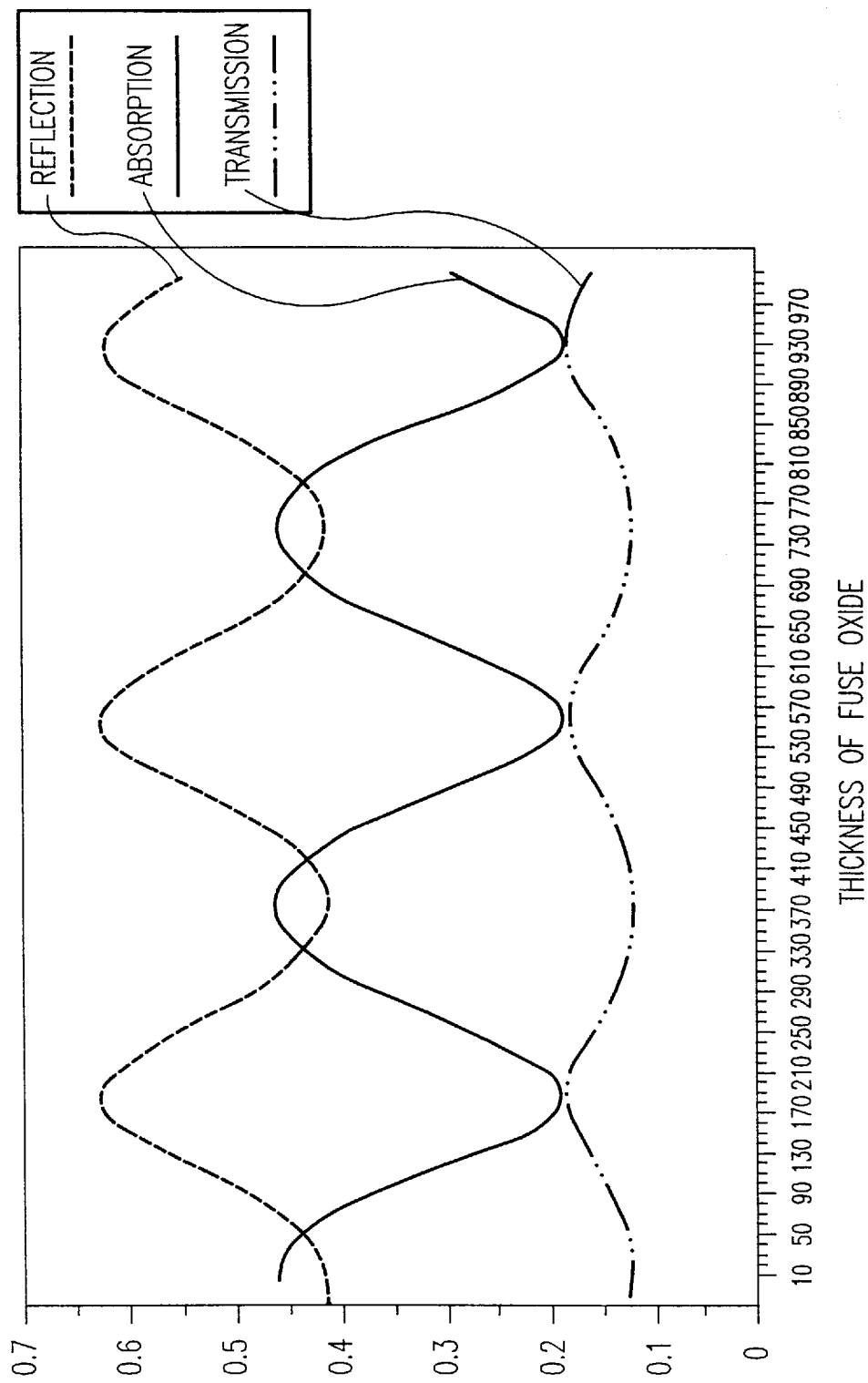
FIG. 2 is a graph showing the sinusoidal functions for reflection, absorption and transmission of the normal laser beam in FIG. 1 as a function of the thickness of the stack.
Figure 7:
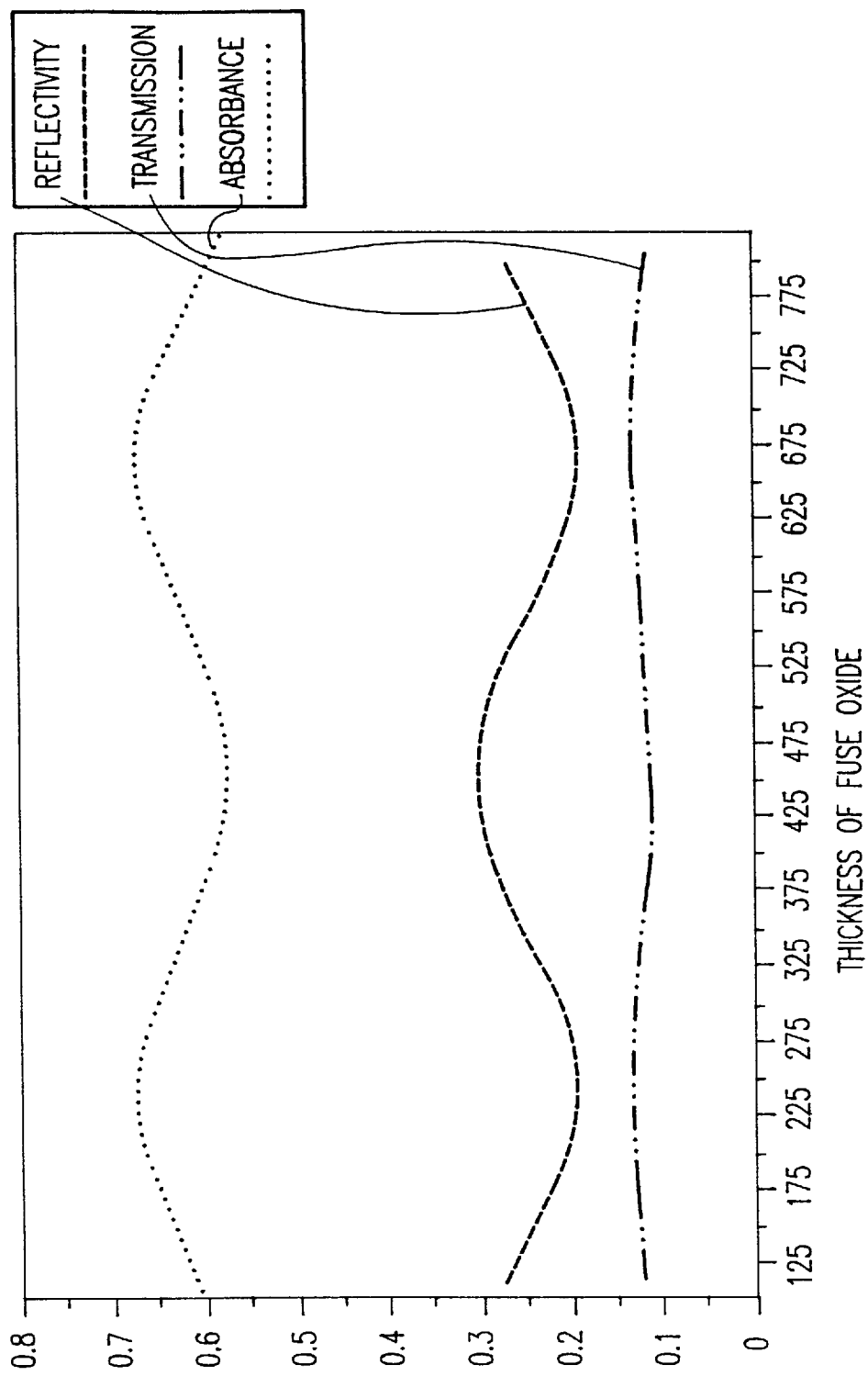
FIG. 7 is a graph showing the functions for reflection, absorption and transmission of laser beam at 45° as a function of thickness of fuse oxide for P polarized light.

An added process benefit from this angular dependence of the laser energy coupling is an improved process window. For reference, compare FIG. 7 to FIG. 2. In FIG. 7, for an angle of incidence of 45°, the total absorption of the film changes from about 62% to 68% as the stack changes thickness from 100 nm to 800 nm. In contrast, that same stack thickness variation at normal incidence changes the energy absorbed by over 20%. Thus, normal process uniformity variations, both wafer to wafer and within a wafer, would have a much lower probability of success and therefore lower yield at normal incidence fuse blow compared to angled laser fuse blow.

An added benefit of the oblique angle is that now laser energy is capable of being absorbed by the edge of the device being ablated as well as the top. This energy coupling further adds to the ablation energy into the stack.

Figure 8:
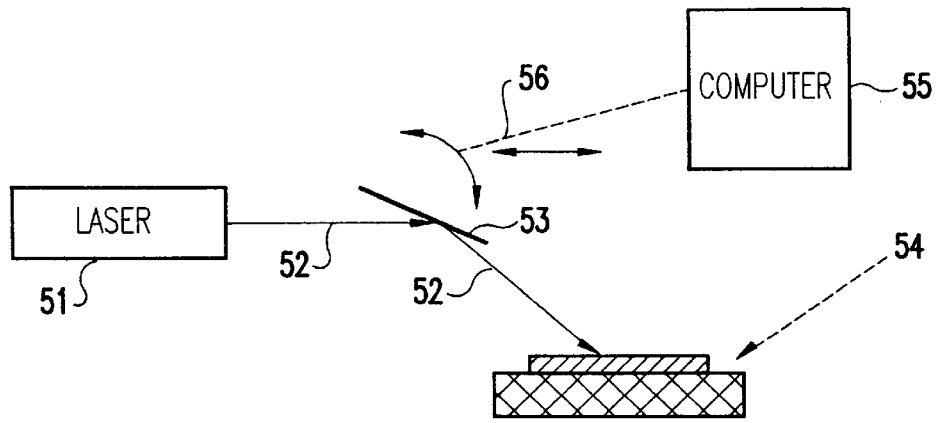
FIG. 8 is a schematic diagram showing an implementation of the invention, using a movable mirror.

Three ways of implementing the invention are shown in FIGS. 8, 9, 10 and 11. In FIG. 8, a laser 51 directs a beam 52 toward a rotatable and translatable mirror 53 which deflects the beam 52 toward the wafer 54 on a stage. The angle at which the beam 52 contacts the wafer 54 is dependent upon the rotation of the rotatable mirror 53. The rotation of mirror 53 may be controlled by a computer 55 which is used to calculate the optimum angle of incidence and direct the rotation of the mirror as represented by the curved arrow and dotted line 56 based on its calculations. The translation of the mirror 53 is also controlled by the computer 55 to direct the laser beam to successive different locations on the wafer 54.

Figure 9:
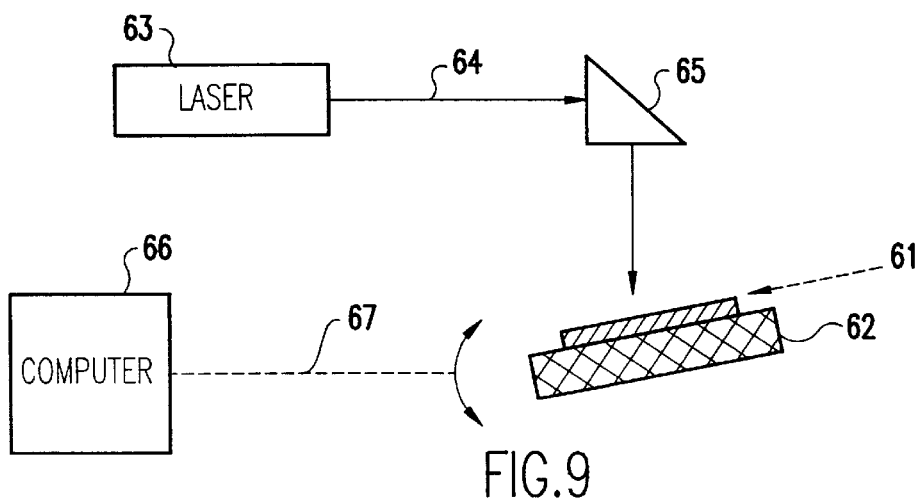
FIG. 9 is schematic diagram showing an implementation of the invention, using a rotatable stage.

In FIG. 9, a wafer 61 is placed on a rotatable and translatable stage 62. A laser 63 directs a beam 64 through a prism 65 to the wafer 61. The angle at which the beam 64 contacts the wafer 61 depends upon the rotation of the stage 62. The rotation of the wafer may be accomplished with a goniometer in this configuration. A computer 66 may also be used in this configuration to perform the calculations of optimum angle and control the rotation of the wafer as represented by the curved arrow and dotted line 67. Translation of the stage 62 by, for example, conventional stepper motors under the control of computer 66 is used to direct the laser beam to successive different locations on the wafer 61. Note that and in the embodiment 11, the prism 65 is rotatable substituted for the mirror 53 in the implementation of FIG. 8.

Figure 10:
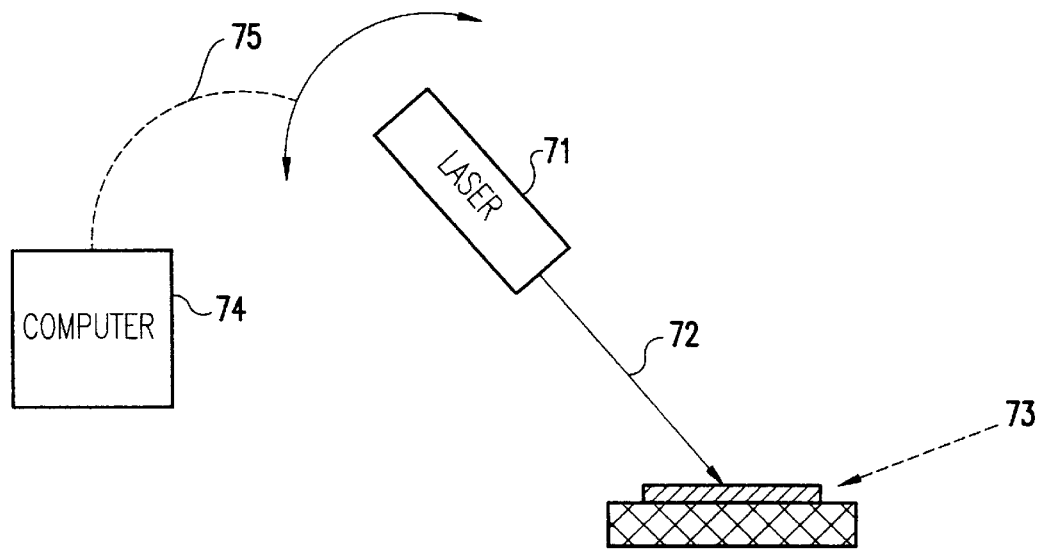
FIG. 10 is schematic diagram showing an implementation of the invention, using a rotatable laser.

A third implementation is shown in FIG. 10. Here, a rotatable and translatable laser 71 directs a beam 72 to a wafer 73. The rotation of the laser 71 may again be controlled by a computer 74 as represented by the curved arrow and dotted line 75. The optimum angle of incidence is calculated using standard formulas and parameters from the particular wafer which are based on thicknesses of the films and index of refraction of films on a particular wafer.

While the invention has been described in terms of preferred embodiments, those skilled in the art will recognize that the invention can be practiced with modification within the spirit and scope of the appended claims.

Having thus described our invention, what we claim as new and desire to secure by letters patent is as follows:

1. A method of laser ablation of a fuse under a multilayer dielectric stack on a wafer having an integrated circuit device comprising the steps of:
    matching a transmission angle of a laser beam to an index of refraction of said dielectric stack; and
    transmitting a laser beam from a laser at said angle through said dielectric stack to improve coupling of laser energy to the stack and reduce overall process sensitivity of stack variation.

2. A method of laser ablation as in claim wherein said angle is produced by tilting the wafer relative to the laser.

3. A method of laser ablation as in claim 1 wherein said angle is produced by deflecting the laser beam to the wafer and rotating an angle of deflection relative to the wafer.

4. A method of laser ablation as in claim 3 wherein the deflection of the laser beam is by a rotatable mirror.

5. A method of laser ablation as in claim 3 wherein the deflection of the laser beam is by a rotatable prism.

6. A method of laser ablation as in claim 1 wherein said angle is produced by rotating the laser relative to the wafer.

7. An apparatus for laser ablation of a fuse under a multilayer dielectric stack on a wafer having an integrated circuit device comprising:
    a laser sending a beam to said wafer;
    a stage for said wafer; and
    a means for matching a transmission angle of the laser beam to an index of refraction of said dielectric stack and adjusting an angle of incidence of said beam on said wafer to improve coupling of laser energy to the stack and reduce overall process sensitivity of stack variation.

8. An apparatus for laser ablation as in claim 7 wherein said means for adjusting comprises means rotating said stage.

9. An apparatus for laser ablation as in claim 7 wherein said means for adjusting comprises means optically deflecting said beam.

10. An apparatus for laser ablation as in claim 9 wherein said means for optically deflecting said beam is a rotatable mirror.

11. An apparatus for laser ablation as in claim 9 wherein said means for optically deflecting said beam is a prism.

12. An apparatus for laser ablation as in claim 11 wherein said prism is rotatable.

13. An apparatus for laser ablation as in claim 7 wherein said adjusting means includes a rotatable laser.

14. An apparatus for laser ablation as in claim 7 further comprising a computer to calculate said optimal angle of incidence for a particular wafer and direct said means for adjusting.

* * * * *

UNITED STATES PATENT AND TRADEMARK OFFICE
CERTIFICATE OF CORRECTION

PATENT NO. : 5,886,320
DATED : March 23, 1999
INVENTOR(S) : Antonio R. Gallo

Figure 11:
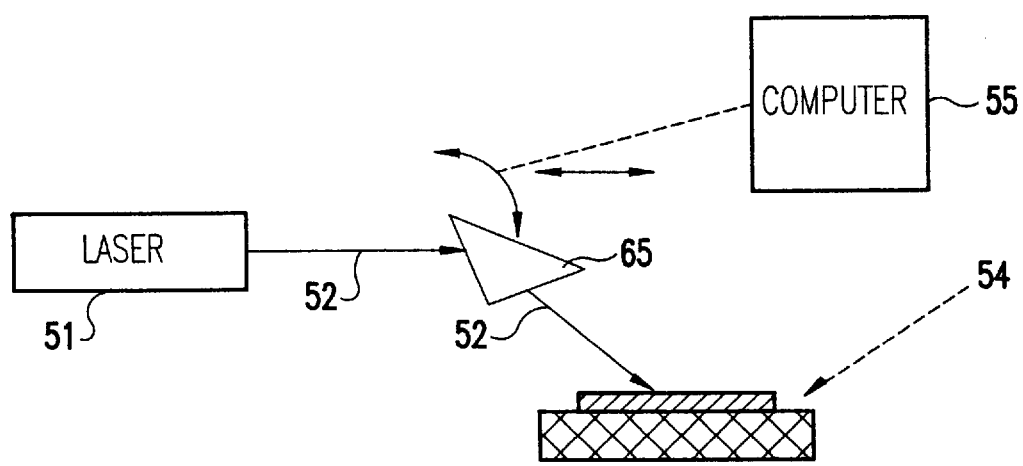
FIG. 11 is a schematic diagram showing an implementation of the invention, using a rotatable prism.

It is certified that error appears in the above-identified patent and that said Letters Patent is hereby corrected as shown below:

On column 3, lines 51-52, delete "and in the embodiment 11, the prism 65 is rotatable substituted" and replace with --in the embodiment of Figure 11, the prism 65 is rotatable and substituted--.

Signed and Sealed this

Seventh Day of December, 1999

Attest:

Q. TODD DICKINSON

Attesting Officer

Acting Commissioner of Patents and Trademarks